United States Patent [19]

Mattausch et al.

[11] Patent Number: 5,012,450
[45] Date of Patent: Apr. 30, 1991

[54] READ AMPLIFIER FOR STATIC MEMORIES IN CMOS TECHNOLOGY

[75] Inventors: Hans-Juergen Mattausch, Kirchheim; Klaus Althoff, Munich; Gerd Neuendorf, Germering, all of Fed. Rep. of Germany

[73] Assignees: Siemens Aktiengesellschaft, Berlin; Siemens Aktiengesellschaft, Munich, both of Fed. Rep. of Germany

[21] Appl. No.: 222,006

[22] Filed: Jul. 8, 1988

[30] Foreign Application Priority Data

Aug. 18, 1987 [DE] Fed. Rep. of Germany ....... 3727558

[51] Int. Cl.$^5$ .................................................. G11C 7/00
[52] U.S. Cl. ............................. 365/208; 365/189.11; 365/203; 307/530
[58] Field of Search ............... 365/207, 208, 189.01, 365/189.11, 203, 205; 307/530

[56] References Cited

U.S. PATENT DOCUMENTS

| 4,031,415 | 6/1977 | Redwine et al. | 365/205 |
| 4,508,980 | 4/1985 | Puar | 307/530 |
| 4,511,810 | 4/1985 | Yukawa | 307/530 X |
| 4,697,112 | 9/1987 | Ohtani et al. | 307/530 |
| 4,813,022 | 3/1989 | Matsui et al. | 307/530 X |

OTHER PUBLICATIONS

IEEE Journal on Solid State Circuits, vol. SC 19, No. 5, Oct. 1984, pp. 545-551, A 16 ns 2k X 8 Bit Full CMOS SRAM by Okazaki et al.
IEEE Journal of Solid State Circuits, vol. SC-19, No. 5, Oct. 1984, pp. 552-556 by Childs et al. and Ryan Hirose.

*Primary Examiner*—James W. Moffitt
*Attorney, Agent, or Firm*—Hill, Van Santen, Steadman & Simpson

[57] ABSTRACT

A read amplifier formed of a load component (L), a differential amplifier component (DIFF), a compensation transistor (N6), a switching transistor (P1) connected between a supply voltage ($V_{DD}$) and the load component (L). The pre-loading potential of the read amplifier at its outputs LA, $\overline{LA}$ is about 2.5 volts. During the pre-loading phase, the two supply voltages ($V_{DD}$, $V_{22}$=ground) are disconnected and the pre-loading potential is established by compensation of capacitances at the outputs LA, $\overline{LA}$ which results in an improved read amplifier.

11 Claims, 2 Drawing Sheets

READ AMPLIFIER FOR STATIC MEMORIES IN CMOS TECHNOLOGY

BACKGROUND OF THE INVENTION

1. Field of the Invention

This invention is related to read amplifiers which have at least one load component, at least one differential amplifier and a compensation transistor.

The read amplifier of the invention primarily is utilized in static memories (SRAMs). A SRAM forms a memory wherein after the address has been prescribed, data can be stored under such address and can be read out again with random access. For technical reasons, individual memory cells are not linearly arranged, but are arranged in a quadratic matrix form. Static memories (SRAMs) are preferably utilized in smaller computer systems wherein there are higher costs as compared to dynamic memories (DRAMs) which are offset due to the simpler and cheaper system architect.

2. Description of the Prior Art

Earlier developments in static memories resulted in three different semiconductor technologies. First, bipolar technology; second, NMOS technology; and third, CMOS technology. The CMOS technology is utilized for the read amplifier of the invention which is considered to be an important functional component part of static memories.

Due to the simple peripheral circuits, over 60% of the chip area is covered with memory cells. The remainder of the chip area is principally for row and column decoders as well as for input amplifiers and for read amplifiers.

The circuit oriented arrangement of the read amplifier has a strong influence on important characteristics of the static memory. Thus, for example, the access time and the amount of power dissipated are determined by the properties of the read amplifier.

The following publications disclosed read amplifiers for static CMOS memories:

1. Childs et al, IEEE Journal of Solid State Circuits, Vol. SC-19, Pages 545 through 551, October 1984; and
2. Okazaki et al IEEE Journal of Solid State Circuits, Vol. SC-19, Pages 552 through 556 of October 1984.

The first publication by Childs et al, discloses a 4K×4 CMOS static RAM which is produced with a single polysilicon layer and the second publication by Okazaki et al discloses a very fast 2K×8 bit CMOS SRAM which enables an access time of 16ns which is comparable to bipolar SRAMs of the same complexity. Both of these publications disclose circuits for read amplifiers which have load components as well as the actual memory cell portion shown in FIG. 10 in the Childs et al publication and in FIG. 6 in the Okazaki et al publication.

FIGS. 1 and 2, except for FIG. 2c, in combination with FIG. 1 show prior art read amplifiers. The read amplifier is divided into a p-channel load component and into a differential amplifier component and there are a number of different circuit possibilities for the p-channel load component. The differential amplifier component is composed of three n-channel field effect transistors which are interconnected in a traditional manner and utilizes an additional p-channel compensation transistor. When clocked memories which have preloading phase are utilized, the compensation transistor improves the compensation of the read amplifier outputs LA and $\overline{LA}$ during the preloading phase at the first two load component circuits illustrated in FIGS. 2b and 2c. The turn-on of the compensation transistor P4 during the preloading phase and the turn-off during interpretation phase are controlled with a signal at the input $\overline{AG}$.

When using the different load components for read amplifier shown in FIGS. 2b, 2c and 2d, the preloading potential $V_{DD}$ or, respectively, $V_{DD}-V_{THP}$ exists at the output LA and $\overline{LA}$ during the preloading phase ($\overline{AG}$="0", EN="0"). $V_{THP}$ of about 0.8 volts identifies the threshold voltage of a p-channel transistor. Such a high preloading potential, however, prevents short access times.

SUMMARY OF THE INVENTION

It is an object of the present invention to provide a read amplifier which allows extremely short access times.

The object of the invention is achieved in that a switching transistor is provided between the load component and a voltage $V_{DD}$ and a gate terminal of the switching transistor together with a gate terminal of the compensation transistor provide a first circuit input.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIGS. 2b through 2d illustrate practical circuit diagrams for the load component;

DESCRIPTION OF THE PREFERRED EMBODIMENT

Figure 1:
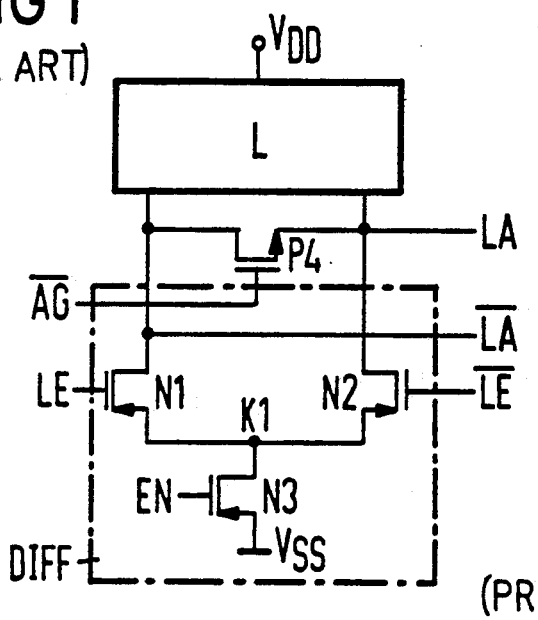
FIG. 1 illustrates a prior art read amplifier for static CMOS memories.

FIG. 1 illustrates a prior art read amplifier for static CMOS memories. The read amplifier includes a load component L, a differential amplifier component DIFF and a compensation transistor which is formed as a p-channel field effect transistor P4. The load component L is connected to a voltage $V_{DD}$ and also to the differential amplifier component DIFF by way of two connecting lines from which the two outputs of the read amplifier LA and $\overline{LA}$ are supplied. The p-channel compensation transistor P4 is located between the load component L and the differential amplifier component DIFF with a gate terminal of the p-channel compensation transistor P4 forming the first circuit input $\overline{AG}$. The p-channel compensation transistor P4 has its drain terminal connected to the second output $\overline{LA}$ of the read amplifier. The source of the compensation transistor P4 is connected to the first output LA.

The differential amplifier component DIFF is composed of three n-channel field effect transistors N1, N2 and N3 electrically connected in a conventional manner with the source terminal of the first n-channel field effect transistor N1 and the source terminal of the second n-channel field effect transistor N2 connected to the drain terminal of the third n-channel field effect transistor N3 and to a common terminal K1. The source terminal of the third n-channel field effect transistor N3 is connected to ground $V_{SS}$ and the gate terminal of the transistor N3 forms the second circuit input EN. The gate terminal of the first field effect transistor N1 and the gate terminal of the second field effect transistor N2 form the first and second inputs of the read amplifier and receive the signals LE and $\overline{LE}$. The drain terminal of the first and second n-channel field effect transistors N1 and N2 are each connected to an output of the read amplifier LA and $\overline{LA}$.

Figure 2A:
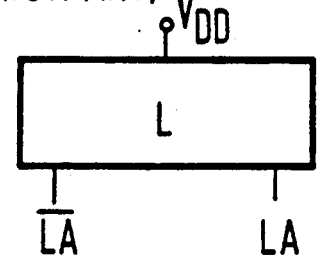
FIGS. 2a through 2d illustrate the load component of a read amplifier.

FIG. 2a shows the load component L which has its one terminal connected to the voltage $V_{DD}$ and its two outputs form the outputs of the read amplifier LA and $\overline{LA}$.

Figure 2B:
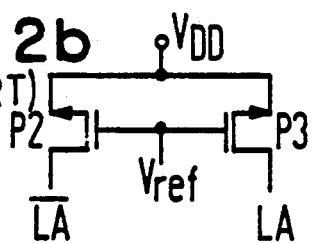
Figure 2C:
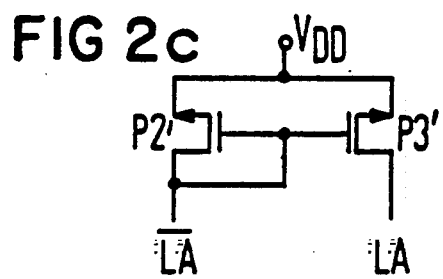
Figure 2D:
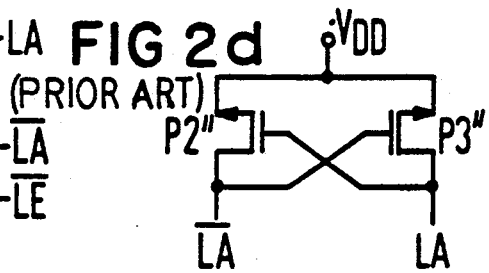

FIGS. 2b, 2c and 2d illustrate practical circuit diagrams for the load component L. The load component shown in FIG. 2b comprises first and second p-channel field effect transistors P2 and P3 which are selected to have identical components and are used as the exclusive load elements in the circuit and they do not make any active contribution to the amplification. The source terminals of the first and second p-channel field effect transistors P2 and P3 are connected together and to a voltage $V_{DD}$. The gate terminals of the first and second p-channel field effect transistors are connected together and to a common reference voltage $V_{ref}$. The drain terminals of the two p-channel field effect transistors P2 and P3 provide two outputs of the load component and in combination with a differential amplifier component and the compensation transistor form the two outputs of the read amplifier LA and $\overline{LA}$.

The interconnection of the read amplifier with a load component such as shown in FIG. 2c comprises a combination which is not prior art. FIG. 2c shows a circuit which is similar to a current mirror and the gate terminals of the first and second p-channel field effect transistors P2' and P3' are connected to the drain region of the first p-channel field effect transistor P2' and are connected to the output $\overline{LA}$ of the load component. An additional coupling of the potential changes at the output $\overline{LA}$ onto the output LA by way of the load component through the second p-channel field effect transistor P3' is shown in this view. Conversely there is no coupling between the output LA onto the output $\overline{LA}$ through the load component L. The source terminals of the two p-channel field effect transistors P2' and P3' are connected to a voltage $V_{DD}$ and the drain terminals of the first and second p-channel field effect transistors respectively form the two outputs LA and $\overline{LA}$.

FIG. 2d is a circuit diagram of a load component L wherein true co-coupling exists. In the third embodiment of the load component, the source terminals of the two p-channel field effect transistors P2″ and P3″ are connected to the voltage $V_{DD}$ and the two drain terminals of the two p-channel field effect transistors P2″ and P3″ form the two outputs LA and $\overline{LA}$ of the read amplifier which is formed of the load component L, the differential amplifier component DIFF and the compensation transistor P4. The drain terminal of the transistor P2″ is connected to the gate of the field effect transistor P3″ and the drain of transistor P3″ is connected to the gate of the field effect transistor P2″.

The different modifications illustrated in FIGS. 2b, 2c and 2d provide amplification that becomes larger and larger with an increasing number of couplings through the load component. The modifications of FIGS. 2b and 2c have only one stable output condition and the circuit of FIG. 2d comprises a bistable element and a voltage compensation of the outputs LA and $\overline{LA}$ must occur after each evaluation and the third n-channel field effect transistor N3 cannot be activated too soon. The two p-channel field effect transistors have the same dimensions in the three different modifications of FIGS. 2b, 2c and 2d.

The inputs of the read amplifier are indicated with LE and $\overline{LE}$. These inputs can be directly formed by the bit line pair of a memory column or by the outputs of a column pre-decoding or respectively, pre-amplifier stage. The inputs LE and $\overline{LE}$ are, respectively, connected to the gate terminals of the identically dimensioned on channel field effect transistors N1 and N2 which have their drain terminals connected to the amplifier outputs LA and $\overline{LA}$, respectively, and the source regions are connected together and to the terminal K1. The read amplifiers turned on or, respectively, off with the turn on signal EN which is applied to the gate of the n-channel field effect transistor N3 which has its drain terminal connected to terminal K1 and its source connected to the ground voltage $V_{SS}$. Normally, five volts are applied to the input EN upon activation. However, certain memory designs use a reference voltage greater than five volts which is corrected against process variations and provides a better current source.

When using read amplifiers such as shown in FIG. 1 in combination with the load component shown in FIGS. 2a through 2d the preloading potential $V_{DD}$ or, respectively, $V_{DD} - V_{THP}$ occurs at the output terminals LA and $\overline{LA}$ during the preloading phase wherein in this case "0" is applied at the inputs $\overline{AG}$ and EN. The $V_{THP}$ which has a typical value of about 0.8 volts is thus the threshold voltage of a p-channel field effect transistor.

If it is desired to achieve short access times in a memory, it is advantageous to adapt the switching threshold of following gates, for example, output drive or latch input to the preloading potential of the read amplifier. A high preloading potential of about 5 volts or, respectively, 4.2 volts as occurs with the read amplifiers of FIG. 1 when used in combination with the load components illustrated in FIGS. 2a-2d is undesirable.

Figure 3:
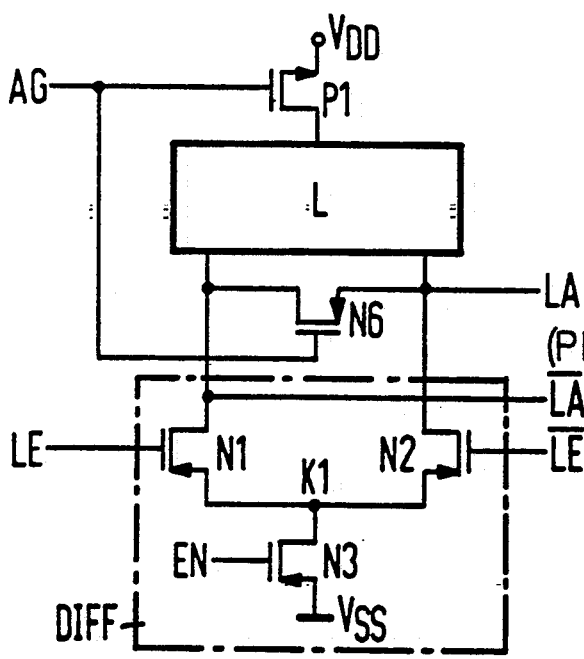
FIG. 3 illustrates a read amplifier of the invention with preloading of the outputs LA and $\overline{LA}$ to medium potential.

A read amplifier which has preloading potential at the outputs LA and $\overline{LA}$ which is about 2.5 volts would be desirable. FIG. 3 illustrates such a read amplifier of the invention which provides preloading of the outputs LA and $\overline{LA}$ to an intermediate potential. The read amplifier is formed of a load component L, a differential amplifier DIFF and a compensation transistor N6 which differs from the compensation transistor P4 shown in FIG. 1 and in FIG. 3 comprises an n-channel field effect transistor. As shown, many of the connections in the circuit of FIG. 3 are similar to those shown in FIG. 1. However, the gate terminal of the compensation transistor N6 is connected to the gate terminal of an additional p-channel field effect transistor P1 and the two gate terminals form the circuit input AG. The additional p-channel field effect transistor P1 is inserted between the operating voltage $V_{DD}$ and the p-channel load component as shown. The transistor P1 has the function of a switch which disconnects the operating voltage $V_{DD}$ during the preloading phase in this case, the inputs are AG is "1" and EN is "0" and turns the operating voltage $V_{DD}$ on during the interpretation phase which is when the inputs are AG="0" and EN="1". The various load components illustrated in FIGS. 2b through 2d can be utilized as the load component L.

In the preloading phase, when the inputs are AG is "1" and EN is "0", the field effect transistors P1 and N3 are nonconductive and the compensation transistor N6 is conducting. Both of the supply voltages $V_{DD}$ and $V_{SS}$ which equals ground are disconnect and the preloading potential is established at the outputs LA and $\overline{LA}$ of the read amplifier due to the compensation of the capacitances. In addition to the value of the capacitors at the outputs LA and $\overline{LA}$ the equilibrium condition at the activated transistors P1 and N3 as well as the symmetry of the gain in the evaluation procedure determine the preloading potential at the outputs LA and $\overline{LA}$. The equilibrium condition can be brought to an intermediate value by the selection of the relative widths of the p-channel and n-channel transistors. The capacitances at the outputs LA and $\overline{LA}$ can be made identical by using a symmetrical design. The gain produced by the p-channel load component according to FIGS. 2b and 2d are also symmetrical. Only the connected p-channel load component of FIG. 2c supplies an asymmetrical gain. For this reason, two different preloading potentials result with one lying somewhat above and the other lying somewhat below the intermediate value. The preloading potential at which preloading is accomplished is determined by the interpretation event which proceeds.

The reason for the selection of the n-channel field effect transistor N6 as the compensation transistor as contrasted to the compensation transistor of FIG. 1 is that the preloading in the circuit of FIG. 3 is carried out to an intermediate potential of about 2.5 volts. The load component modifications of FIGS. 2b through 2d that are used both in the read amplifier of FIG. 3 and of FIG. 1 can also be combined should this prove beneficial in a specific application. For example, a load component as shown in FIG. 2b and in addition a load component of FIG. 2d can be connected to the read amplifier outputs LA and $\overline{LA}$.

Figure 4:
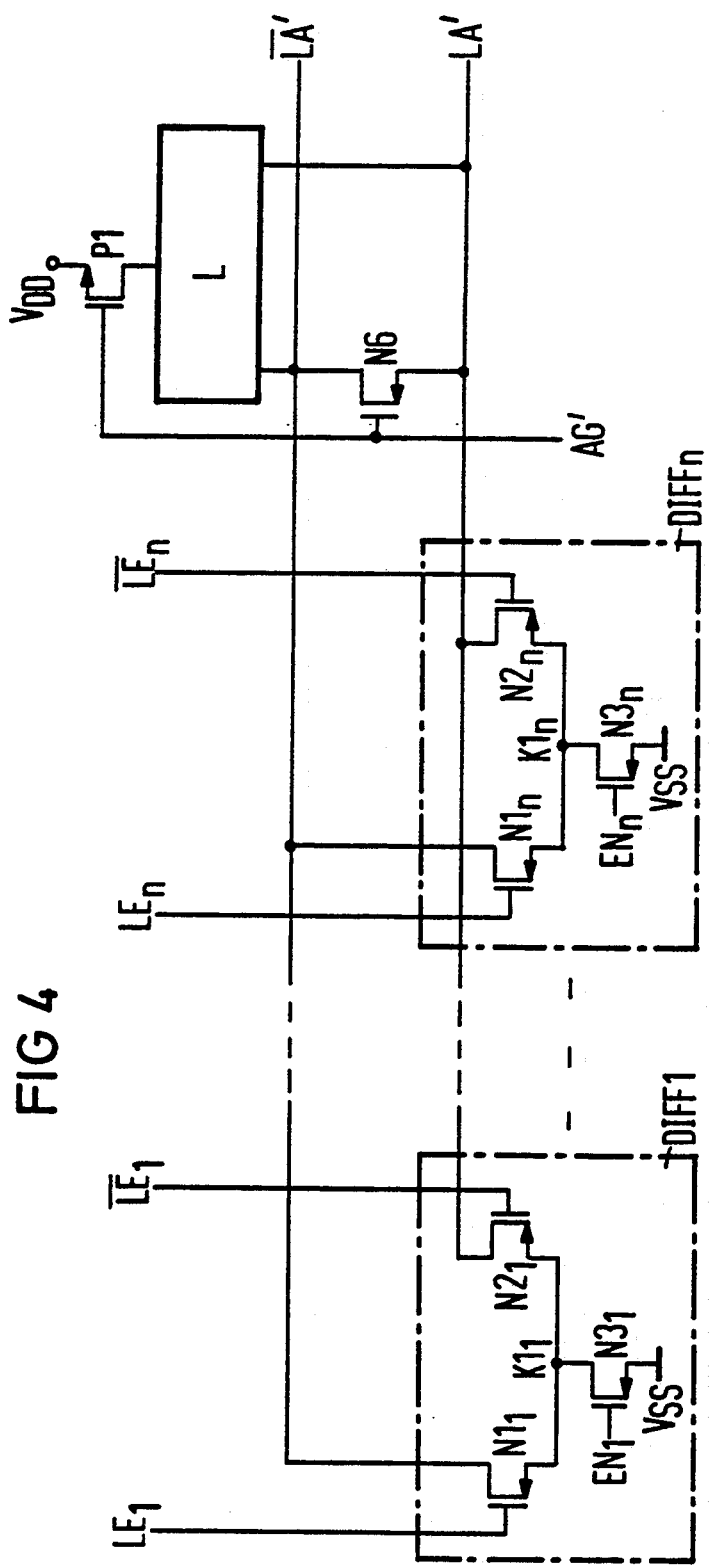
FIG. 4 illustrates a read amplifier of the invention which has preloading of the outputs LA and $\overline{LA}$ to medium potential and which has additional column coding.

FIG. 4 illustrates a read amplifier of the invention which has preloading of the outputs LA and $\overline{LA}$ to an intermediate potential and includes additional column coding. In this case, the outputs LA and $\overline{LA}$ of a plurality of read amplifiers are connected to a common bus.

So as to produce the read amplifier, the differential amplifier component is constructed n times and the load component L, the n-channel compensation transistor N6 and the p-channel field effect transistor P1 that is inserted between the operating voltage $V_{DD}$ and the load component L are integrated only one time. The realization of the n differential amplifier components DIFF1 . . . DIFFn are constructed in an analogous manner to the differential amplifier component DIFF illustrated in FIGS. 1 and 3. Each of the differential amplifier components is composed of three respective n field effect transistors $N1_1, N2_1, N3_1... N1_n, N2_n, N3_n$. The input signals for the read amplifiers are applied to the gate terminals of the n-channel of the field effect transistors $N1_1, N2_1$ by way of the inputs $LE_1$ or, respectively, $\overline{LE_1}$ for the first differential amplifier DIFF1. In an analogous manner, the inputs $LE_n$ or, respectively, $\overline{LE_n}$ of the $n^{th}$ differential amplifier DIFFn are connected to the gate terminal of the n-channel field effect transistor $N1_n$ or, respectively, $N2_n$. One of the two outputs of each and every differential amplifier component DIFF1...DIFFn are connected in parallel to each other and form the outputs LA' or, respectively, $\overline{LA'}$.

In a manner analogous to the circuits of FIGS. 1 and 3, the n-channel compensation transistor N6 and the p-channel field effect transistor P1 are connected together and the gate terminals form the first circuit input AG'.

Also, as in the differential amplifier components of FIGS. 1 and 3, the gate terminals of the third n-channel field effect transistors $N3_1 . . . N3_n$ form the second circuit input $EN_1 . . . EN_n$ of the corresponding differential amplifier component DIFF1 . . . DIFFn.

Figure 6:
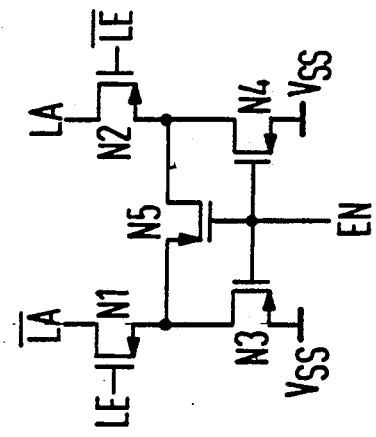
FIG. 6 illustrates another circuit modification of the differential amplifier component of the read amplifier.
Figure 5:
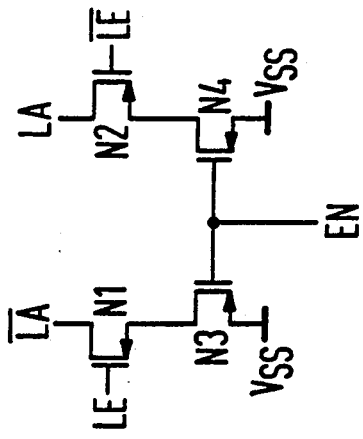
FIG. 5 illustrates a circuit modification of the differential amplifier component of the read amplifier.

The read amplifiers comprising the column decoding arrangement of FIG. 4 have a weakness which in certain specific applications, for example, when a large number of differential amplifier components are interconnected occurs. This weakness is comprised because a transverse current between the outputs of the read amplifiers LA', $\overline{LA'}$ can flow through the terminals $K1_1 . . . K1_n$ of the differential amplifier components when the third field effect transistors $N3_1 . . . N3_n$ are not activated. The maximum signal gain is limited by such transverse current. FIGS. 5 and 6 illustrate circuits wherein the transverse current problem does not occur.

FIG. 5 illustrates a differential amplifier component composed of four n-channel field effect transistors N1, N2, N3 and N4 and the first two channel field effect transistors N1 and N2 have drain terminals which form the output terminals LA and $\overline{LA}$ and the gate terminals of the field effect transistors N1 and N2 receive the inputs LE and $\overline{LE}$ of the read amplifier. The source terminal of the field effect transistor N1 is connected to the drain terminal of a third n-channel field effect transistor N3 and the source terminal of the transistor N3 is connected to ground $V_{SS}$. The second n-channel field effect transistor N2 has its source connected to the drain terminal of the fourth n field effect transistor N4 which has its source connected to ground $V_{SS}$. The circuit input EN is connected to the gate terminals of the third and fourth field effect transistors N3 and N4 in the embodiment of FIG. 5 which differs from that of FIGS. 1, 3 and 4.

FIG. 6 illustrates a differential amplifier component which is formed in an analogous manner to that of FIG. 5 wherein however a fifth n-channel effect transistor N5 is additionally utilized. The fifth n-channel field effect transistor N5 has its source connected to the source of the first n-channel field effect transistor N1 and to the drain of the third n-channel field effect transistor N3. The drain terminal of transistor N5 is connected to source terminal of the second n-channel field effect transistor N2 and to the drain terminal of the fourth n-channel field effect transistor N4. The gate terminal of the fifth n-channel field effect transistor N5 is connected to the gate terminals of the third and fourth n-channel field effect transistors N3 and N4 and to the circuit input EN.

The use of the additional field effect transistors N3 and N4 shown in FIG. 5 and the field effect transistors N3, N4 and N5 of FIG. 6 suppress transverse currents between the outputs $\overline{LA}$ and LA with the signal at the circuit input EN.

Although the invention has been described with respect to preferred embodiments, it is not to be so limited as changes and modifications can be made which are within the full intended scope of the invention as defined by the appended claims.

We claim as our invention:

1. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), wherein said switching transistor (P1) is a p-channel field effect switching transistor which has a source terminal which is connected to the voltage source ($V_{DD}$) and has a drain terminal which is connected to said load component (L), wherein first and second p-channel field effect transistors (P2, P2', P2"; P3, P3', P3") form one load component (L); source terminals of said p-channel field effect transistors (P2, P2', P2"; P3, P3', P3") are connected to the drain terminal of said switching transistor (P1); and the drain terminals of said first and second p-channel field effect transistors (P2, P2', P2"; P3, P3', P3") respectively, provide the first and the second outputs of said read amplifier (LA, $\overline{LA}$), and wherein the gates of said switching and compensating transistors are connected together.

2. A read amplifier according to claim 1, wherein M load components where M is a whole number are connected in parallel to each other.

3. A read amplifier according to claim 1, wherein the gate terminals of said first and second p-channel field effect transistors (P2, P3) are connected to a reference voltage ($V_{Ref}$).

4. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), wherein first and second p-channel field effect transistors (P2, P2', P2"; P3, P3', P3") form one load component (L); source terminals of said p-channel field effect transistors (P2, P2', P2"; P3, P3', P3") are connected to the drain terminal of said switching transistor (P1); and the drain terminals of said first and second p-channel field effect transistors (P2, P2', P2"; P3, P3', P3") respectively, provide the first and the second outputs of said read amplifier (LA, $\overline{LA}$), and wherein the gate terminals of said first and second p-channel field effect transistors (P2', P3') are both connected to the drain terminal of said first p-channel field effect transistor (P2').

5. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), and wherein n (n is a whole number) differential amplifier components are connected in parallel; at least three n-channel field effect transistors (N1$_i$, N2$_i$, N3$_i$, i=1...n) are provided for each differential amplifier component; a drain terminal of the first and, respectively, the second n-channel field effect transistor (N1$_i$, N2$_i$) of the n differential amplifier components is connected to the first and, respectively, second output of said read amplifier (LA, $\overline{LA}$); the respective gate terminals of said first and said second n-channel field effect transistors (N1$_i$, N2$_i$) of said n differential amplifier components forming input terminals to said read amplifier (LE$_i$, $\overline{LE}_i$).

6. A read amplifier according to claim 5, in which in the differential amplifier component the source terminals of said first and said second n-channel field effect transistors (N1$_i$, N2$_i$) are connected to a drain terminal of the third n-channel field effect transistor (N3$_i$); a gate terminal of said third n-channel field effect transistor (N3$_i$) comprises a second circuit input (EN$_i$); and a source terminal of said third n-channel field effect transistor (N3$_i$) is connected to ground potential ($V_{SS}$).

7. A read amplifier according to claim 5, in which in the differential amplifier component, the source terminal of the first n-channel field effect transistor (N1) is connected to the drain terminal of the third n-channel field effect transistor (N3) and the source terminal of the second n-channel field effect transistor (N2) is connected to a drain terminal of the fourth n-channel field effect transistor (N4); gate terminals of said third and said fourth n-channel field effect transistors (N3, N4) comprise a second circuit input (EN); and the source terminals of said third and said fourth n-channel field effect transistors (N3, N4) are connected to ground potential ($V_{SS}$).

8. A read amplifier according to claim 7, wherein a fifth n-channel field effect transistor (N5) is provided in the differential amplifier component; a source terminal of said fifth n-channel effect transistor (N5) is connected to the source terminal of said first n-channel field effect transistor (N1), a drain terminal of said fifth n-channel field effect transistor (N5) is connected to the source terminal of said second n-channel field effect transistor (N2) and a gate terminal of the fifth n-channel field effect transistor (N5) is connected to the gate terminals of said third and fourth n-channel field effect transistors (N3, N4).

9. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), wherein said switching transistor (P1) is a p-channel field effect switching transistor which has a source terminal which is connected to the voltage source ($V_{DD}$) and has a drain terminal which is connected to said load component (L), and wherein said compensation transistor (N6) is an n-channel field effect transistor which has a source terminal which is connected to a first output (LA) of said read amplifier and has a drain terminal which is connected to the second output ($\overline{\text{LA}}$) of said read amplifier.

10. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), wherein said switching transistor (P1) is p-channel field effect switching transistor which has a source terminal which is connected to the voltage source ($V_{DD}$) and has a drain terminal which is connected to said load component (L), and wherein n (n is a whole number) differential amplifier components are connected in parallel; at least three n-channel field effect transistors ($N1_i$, $N2_i$, $N3_i$, i=1...n) are provided for each differential amplifier component; a drain terminal of the first and, respectively, the second n-channel field effect transistor ($N1_i$, $N2_i$) of the n differential amplifier components is connected to the first or, respectively, second output of said read amplifier (LA, $\overline{\text{LA}}$); the source terminal of the first n-channel field effect transistor (N1) is connected to the drain terminal of the third n-channel field effect transistor (N3) and the source terminal of the second n-channel field effect transistor (N2) is connected to a drain terminal of the fourth n-channel field effect transistor (N4); a source terminal of a fifth n-channel field effect transistor (N5) is connected to the source terminal of said first n-channel field effect transistor (N1), a drain terminal of said fifth n-channel field effect transistor (N5) is connected to the source terminal of said second n-channel field effect transistor (N2) and a gate terminal of the fifth n-channel field effect transistor (N5) is connected to the gate terminals of said third and fourth n-channel field effect transistors.

11. A read amplifier comprising at least one load component (L), at least one differential amplifier component (DIFF) and a compensation transistor (N6), characterized in that a switching transistor (P1) is directly connected between said load component (L) and a voltage source $V_{DD}$; said switching transistor disconnecting the operating voltage during a preloading phase and turning it on during an interpretation phase; and a gate terminal of said switching transistor (P1) forms a first circuit input (AG) in common with a gate terminal of said compensation transistor (N6), wherein said switching transistor (P1) is a p-channel field effect switching transistor which has a source terminal which is connected to the voltage source ($V_{DD}$) and has a drain terminal which is connected to said load component (L), wherein first and second p-channel field effect transistors (P2, P2', P2''; P3, P3', P3'') form one load component (L); source terminals of said p-channel field effect transistors (P2, P2', P2''; P3, P3', P3'') are connected to the drain terminal of said switching transistor (P1); and the drain terminals of said first and said second p-channel field effect transistors (P2, P2', P2''; P3, P3', P3'') respectively, provide the first and the second outputs of said read amplifier (LA, $\overline{\text{LA}}$), and wherein the gate terminals of said first and second p-channel field effect transistors (P2', P3') are both connected to the drain terminal of said first p-channel field effect transistor (P2').

* * * * *